(12) United States Patent
Kain (10) Patent No.: US 8,791,667 B2
(45) Date of Patent: Jul. 29, 2014

(54) INDUCTIVE CHARGE BALANCING (75) Inventor: Clemens Kain, Kammern (AT)

(73) Assignee: Infineon Technologies AG, Neubiberg (DE)

( * ) Notice: Subject to any disclaimer, the term of this patent is extended or adjusted under 35 U.S.C. 154(b) by 625 days.

(21) Appl. No.: 13/017,600

(22) Filed: Jan. 31, 2011

(65) Prior Publication Data

US 2012/0194134 A1    Aug. 2, 2012

(51) Int. Cl.
*H02J 7/00*  (2006.01)
*H01M 2/00*  (2006.01)

(52) U.S. Cl.
USPC .............. 320/116; 429/10; 320/118; 320/119

(58) Field of Classification Search
USPC ............................................ 320/116; 429/10
See application file for complete search history.

(56) References Cited

U.S. PATENT DOCUMENTS

| | | | | |
|---|---|---|---|---|
| 5,363,047 A | * | 11/1994 | Dresti et al. | 324/510 |
| 5,965,996 A | * | 10/1999 | Arledge et al. | 320/116 |
| 5,982,143 A | * | 11/1999 | Stuart | 320/119 |
| 2011/0076525 A1 | * | 3/2011 | Zhang et al. | 429/10 |
| 2011/0101916 A1 | * | 5/2011 | Densham et al. | 320/116 |

OTHER PUBLICATIONS

Bonfiglio, C., et al., "A Cost Optimized Battery Management System with Active Cell Balancing for Lithium Ion Battery Stacks," IEEE Xplore, Nov. 17, 2009, pp. 304-309.

* cited by examiner

*Primary Examiner* — M'Baye Diao
(74) *Attorney, Agent, or Firm* — Slater & Matsil, L.L.P.

(57) ABSTRACT

Disclosed is a method for charge balancing in a charge storage arrangement having a plurality of charge storage cells connected in series, and a charge balancing circuit.

25 Claims, 6 Drawing Sheets

INDUCTIVE CHARGE BALANCING

TECHNICAL FIELD

Embodiments of the present invention relate to an inductive charge balancing circuit for a charge storage arrangement with a plurality of charge storage cells, and in particular to a method for detecting errors that may occur during operation of such a charge balancing circuit.

BACKGROUND

Rechargeable charge storage arrangements, like accumulators, play an important role in electric vehicles, like electric cars, but also in other mobile electric devices, such as computers. Such charge storage arrangements usually include a plurality of charge storage cells (accumulator cells) connected in series, with the number of cells connected in series being dependent on the supply voltages provided by the individual charge storage cells and being dependent on the desired overall supply voltage to be provided to a load. The supply voltage provided by a storage arrangement including a number of storage cells connected in series corresponds to the sum of the individual supply voltages of the storage cells.

The rechargeable storage arrangement is discharged when it powers the load, and it can be recharged when an external power supply is available. Most types of charge storage cells, such as lithium-ion cells, should not be charged so as to have a supply voltage which is above a given upper voltage limit and should not be discharged so as to have a supply voltage which is below a given lower voltage limit. Otherwise there is the risk of damage or degradation. Due to inevitable variations in the manufacturing process of the storage cells, the capacitances of the individual storage cells may slightly differ from one another, i.e., the capacitances may be "unbalanced". This unbalance may cause some of the storage cells to reach the upper voltage limit during the charging process earlier than other storage cells, and may cause some of the storage cells to reach the lower voltage limit during the discharging process (when a load is powered) earlier than other storage cells. When one of the cells reaches the upper voltage limit the charging process has to be stopped, even if the other cells have not completely been charged yet, and when one of the cells reaches the lower voltage limit the discharging process has to be stopped, even if other cells have not been discharged to their lower limit.

Charge balancing circuits monitor the charging state of the individual storage cells and are configured to selectively charge or discharge individual cells in order to balance the charging states of the individual cells and to provide for an increased efficiency in use of the storage arrangement.

A charge balancing circuit according to a known concept includes inductive storage elements which are inductively coupled. One (or more) of these inductive storage elements is configured to be connected in parallel with the overall arrangement, and the others are configured to be connected in parallel with the individual storage cells. Electronic switches can be used to connect/disconnect the inductive elements to/from the storage arrangement or the storage cells, respectively. By virtue of this arrangement energy can be transferred from one storage cell to the overall arrangement (or parts of it), or from the overall arrangement to one storage cell.

Errors may occur during the operation of such a balancing circuit. These errors include a missing inductive coupling between the individual inductive elements, a defect in one of the inductive elements, or a defect in one of the switches. There is, therefore, a need to detect such errors.

SUMMARY OF THE INVENTION

Embodiments of the invention relate to a method for charge balancing in a charge storage arrangement having a plurality of charge storage cells connected in series. The method includes providing a first inductive storage element configured to be selectively coupled with the storage arrangement, and providing at least one second inductive storage element configured to be selectively coupled with a first one of the storage cells and inductively coupled to the first inductive storage element. In this method, during a first time period energy is taken from one of the storage arrangements and the first storage cell by coupling the associated inductive storage element with the one of the storage arrangement and the one storage cell, and during a second time period which is subsequent to the first time period at least a part of the taken energy is fed back into the other one of the storage arrangements and the first storage cell by coupling the associated first inductive storage element with the other one of the storage arrangements and the first storage cell. The method further includes evaluating at least one of a first voltage and a second voltage at least at one time in the first time period to provide a first evaluation result and at least at one time in the second time period to provide a second evaluation result, wherein the first voltage is dependent on the voltage across the first inductive storage element and the second voltage is dependent on the voltage across one of the storage cells, and detecting an error dependent on the first and the second evaluation result.

Further embodiments of the present invention relate to a charge balancing circuit, including a first inductive storage element configured to be selectively coupled with a storage arrangement comprising a plurality of storage cells connected in series. At least one second inductive storage element is configured to be selectively coupled with a first one of the storage cells of the storage arrangement and inductively coupled to the first inductive storage element and a drive circuit. The drive circuit is configured to couple one of the first and second inductive storage elements with the associated storage arrangement or storage cell for a first time period, and to couple the other one of the first and second inductive storage elements with the associated storage arrangement or storage cell for a second time period subsequent to the first time period. The balancing circuit further comprises an error detection circuit configured to evaluate at least one of a first voltage and a second voltage at least at one time in the first time period to obtain a first evaluation result and at least at one time in the second time period to obtain a second evaluation result. The first voltage is dependent on the voltage across the first inductive storage element and the second voltage is dependent on the voltage across one of the storage cells, and generates an error signal dependent on the first and the second evaluation results.

Embodiments of the present invention will now be explained with reference to the drawings. It should be noted that these embodiments serve to illustrate the basic principles, so that only those features necessary for understanding the basic principles are illustrated. The drawings are not to scale. Further, like reference characters denote like features throughout the drawings.

DETAILED DESCRIPTION OF ILLUSTRATIVE EMBODIMENTS

Figure 1:
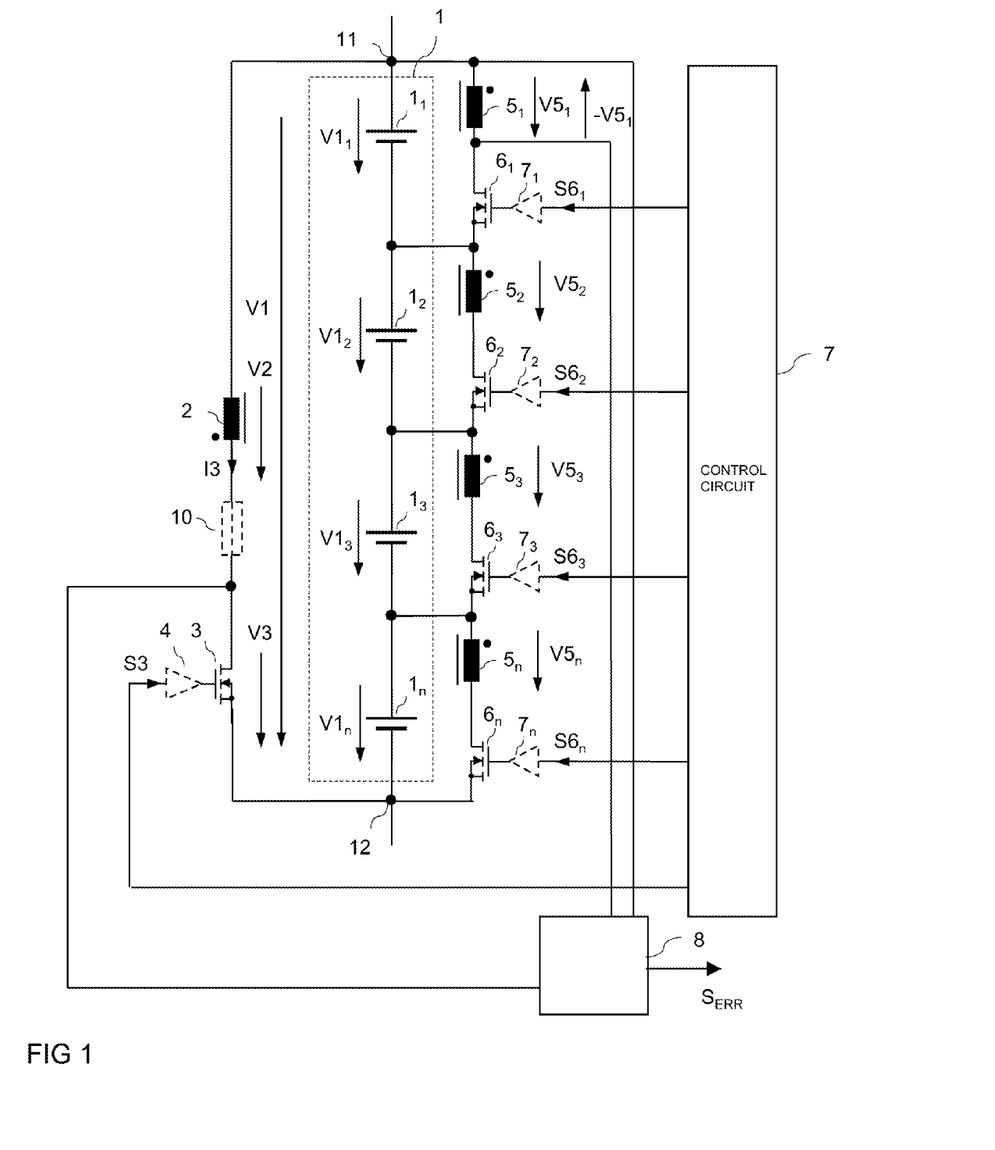
FIG. 1 illustrates a charge storage arrangement with a plurality of storage cells connected in series, and illustrates a charge balancing circuit according to one embodiment coupled to the charge storage arrangement.

FIG. 1 shows a charge storage arrangement 1 which includes a plurality of charge storage cells $1_1$, $1_2$, $1_3$, $1_n$ connected in series. The charge storage arrangement 1 of FIG. 1 includes n=4 storage cells connected in series. However, this is only an example. The number of storage cells connected in series can be arbitrarily selected dependent on the supply voltages $V1_1$, $V1_2$, $V1_3$, $V1_n$ provided by the individual storage cells and dependent on the desired overall supply voltage V1 provided by the storage arrangement 1.

The charge storage arrangement 1 includes load terminals 11, 12 configured to connect the charge storage arrangement 1 to a load (not shown) and/or to a charging circuit (not shown). The charge storage arrangement 1 is a rechargeable charge storage arrangement, i.e., it can supply power/energy to a load when connected to the load, and it can be re-charged when connected to a charging circuit. The charge storage arrangement 1 is, for example, a battery or an accumulator.

Figure 2:
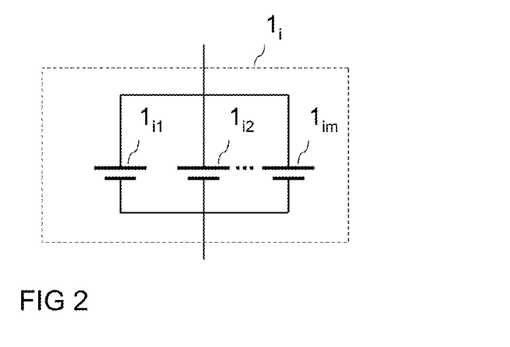
FIG. 2 illustrates a first embodiment of a storage cell having several sub-cells connected in series.

Each of the storage cells $1_1$-$1_n$ of FIG. 1 may include one sub-cell or may include several sub-cells. Referring to FIG. 2, which illustrates a first embodiment of a storage cell $1_i$ (wherein $1_i$ denotes one of the storage cells $1_1$-$1_n$ of FIG. 1), the storage cell $1_i$ may include a series circuit with several sub-cells $1_{i1}$, $1_{i2}$, $1_{im}$. These sub-cells may be implemented as accumulator or battery cells, like Lithium ion cells.

Figure 3:
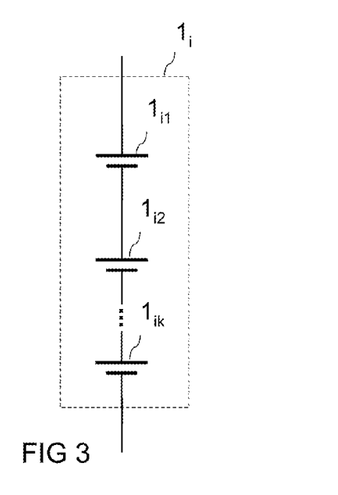
FIG. 3 illustrates a first embodiment of a storage cell having several sub-cells connected in parallel.

Referring to FIG. 3, which illustrates a further embodiment of implementing a storage cell $1_i$, the storage cell $1_i$ may also include several sub-cells $1_{i1}$, $1_{i2}$, $1_{ik}$ connected in parallel. These sub-cells may be implemented as battery or accumulator cells, like lithium ion cells. Of course, the individual storage cells can also be implemented with combinations of series circuits and parallel circuits of sub-cells.

FIG. 1 further illustrates an inductive charge balancing circuit which is configured to balance the charging states of the individual storage cells $1_1$-$1_n$. Balancing the charging states of the storage cells $1_1$-$1_n$ involves taking energy from the storage arrangement 1 and selectively feeding back the taken energy into one of the storage cells $1_1$-$1_n$, or involves selectively taking energy from one of the storage cells and to feed the taken energy back into the overall charge storage arrangement 1. The first type of charge balancing, when energy is selectively fed into one of the storage cells $1_1$-$1_n$, will be referred to as bottom balancing in the following; and the second type of charge balancing, when energy is selectively taken from one of the storage cells $1_1$-$1_n$, will be referred to as top balancing in the following. Bottom balancing is, for example, used when the voltage across one of the storage cells or across some of the storage cells is lower than the voltage across the majority of the storage cells. Top balancing is, for example, performed when the voltage across one storage cell or across some of the storage cells is higher than the voltage across the majority of the storage cells. Top balancing and bottom balancing can be used during a charging process, i.e., when the charge storage arrangement 1 is charged, and can be used during a discharging process, i.e., when the charge storage arrangement 1 is discharged. By virtue of charge balancing the charging states, which are represented by the voltages provided by the individual storage cells $1_1$-$1_n$, can be balanced, so that the individual storage cells approach critical low-voltage states or critical high-voltage states together, wherein a further discharging of the storage arrangement 1 is to be prevented when a low-voltage state of one storage cell is reached, and a further charging of the storage arrangement 1 is to be prevented when a high-voltage state of one of the storage cells is reached.

The charge balancing circuit of FIG. 1 includes a first inductive storage element 2 configured to be coupled or, more specifically, to be connected in parallel with the storage arrangement 1. To connect the first inductive storage element 2 in parallel with the storage arrangement 1 the charge balancing circuit includes a first switching element 3 connected in series with the first inductive storage element 2. The series circuit with the first inductive storage element 2 and the first switching element 3 is connected in parallel with the charge storage arrangement 1.

The charge balancing circuit of FIG. 1 further includes a plurality of second inductive storage elements $5_1$, $5_2$, $5_3$, $5_n$ each configured to be connected in parallel with one of the storage cells $1_1$-$1_n$. To connect the individual second inductive storage elements $5_1$-$5_n$ in parallel with the associated storage cells $1_1$-$1_n$ the charge balancing circuit further includes a plurality of second switching elements $6_1$, $6_2$, $6_3$, $6_n$. Each of these second switching elements $6_1$-$6_n$ is connected in series with one of the second inductive storage elements $5_1$-$5_n$, and each of these series circuits with one second inductive storage element $5_1$-$5_n$ and one second switching element $6_1$-$6_n$ is connected in parallel with one of the storage cells $1_1$-$1_n$.

The first inductive storage element 2 is inductively coupled with the second inductive storage elements $5_1$-$5_n$ and the second inductive storage elements $5_1$-$5_n$ are inductively coupled with each other so that the first inductive storage element 2 and the second inductive storage elements $5_1$-$5_n$ form a transformer. A transformer core which may inductively couple the individual inductive storage elements is not illustrated in FIG. 1.

The first inductive storage element 2 serves to take energy from the storage arrangement 1 or to feed back energy into the storage arrangement 1 when connected in parallel with the storage arrangement 1. The individual second inductive storage elements $5_1$-$5_n$ serve to take energy from the associated storage cell $1_1$-$1_n$ or to feed energy back into the associated storage cell $1_1$-$1_n$ when connected in parallel with the associated storage cell $1_1$-$1_n$. A storage cell $1_i$ (wherein $1_i$ represents one of the storage cells $1_1$-$1_n$) "associated" with a second inductive storage element $5_i$ (wherein $5_i$ represents one of the second inductive storage elements $5_1$-$5_n$) is that storage cell $1_i$ which is connected in parallel with the series circuit including the inductive storage element $5_i$ and the switching element $6_i$ (wherein $6_i$ represents the second switching element connected in series with the inductive storage element $5_i$). The first inductive storage element 2 is connected in parallel with the storage arrangement 1 when the first switching element 3 is in an on-state (switched on), and a second inductive storage element $5_i$ is connected in parallel with the associated storage cell $1_i$ when the associated switching element $6_i$, which is the switching element $6_i$ connected in series with the inductive storage element $5_i$, is in its on-state (switched on).

The switching elements 3, $6_1$-$6_n$ illustrated in FIG. 1 are MOSFET, in particular, n-type MOSFET. However, this is only an example. Any other type of electronic switching element, like a p-type MOSFET, a bipolar junction transistors (BJT), or an IGBT may be used as well.

In the charge balancing circuit of FIG. 1 a series circuit with a second inductive storage element $5_i$ and a second switching element $6_i$ is connected in parallel with each of the storage cells $1_i$. This allows to selectively take energy from each of the storage cells or to selectively feed energy back into each of the storage cells. It should be noted that the number of series circuits with a second inductive storage element $5_i$ and a switching element $6_i$ could be less than the number of storage cells $1_i$-$1_n$, wherein in this case energy can not selectively be taken from or selectively be fed back into each of the storage cells $1_1$-$1_n$, but only from/into the storage cells having a series circuit with an inductive storage element $5_i$ and a switching element $6_i$ connected thereto.

Referring to FIG. 1, the charge balancing circuit further includes a drive circuit 7 configured to provide a first drive signal S3 for the first switching element 3 and to provide second drive signals S$6_1$-S$6_n$ for the second switching elements $6_1$-$6_n$. The switching elements 3, $6_1$-$6_n$ are switched on, i.e., are in their on-state, when the corresponding drive signal S3, S$6_1$-S$6_n$ assumes an on-level, and the switching elements 3, $6_1$-$6_n$ are switched off, i.e., are in their off-state, when the corresponding drive signals S3, S$6_1$-S$6_n$ assume an off-level. The drive circuit 7 can be implemented as a microcontroller, The drive signals S3, S$6_1$-S$6_n$ can be logic signals that can assume a high-level and a low-level. Optionally, driver stages 4, $7_1$-$7_n$ are connected between the drive circuit 7 and the individual switching elements 3, $6_1$-$6_n$ which generate signal levels suitable for switching on and off the individual switching elements 3, $6_1$-$6_n$ from the drive signals S3, S$6_1$-S$6_n$ provided by the drive circuit 7.

Figure 4:
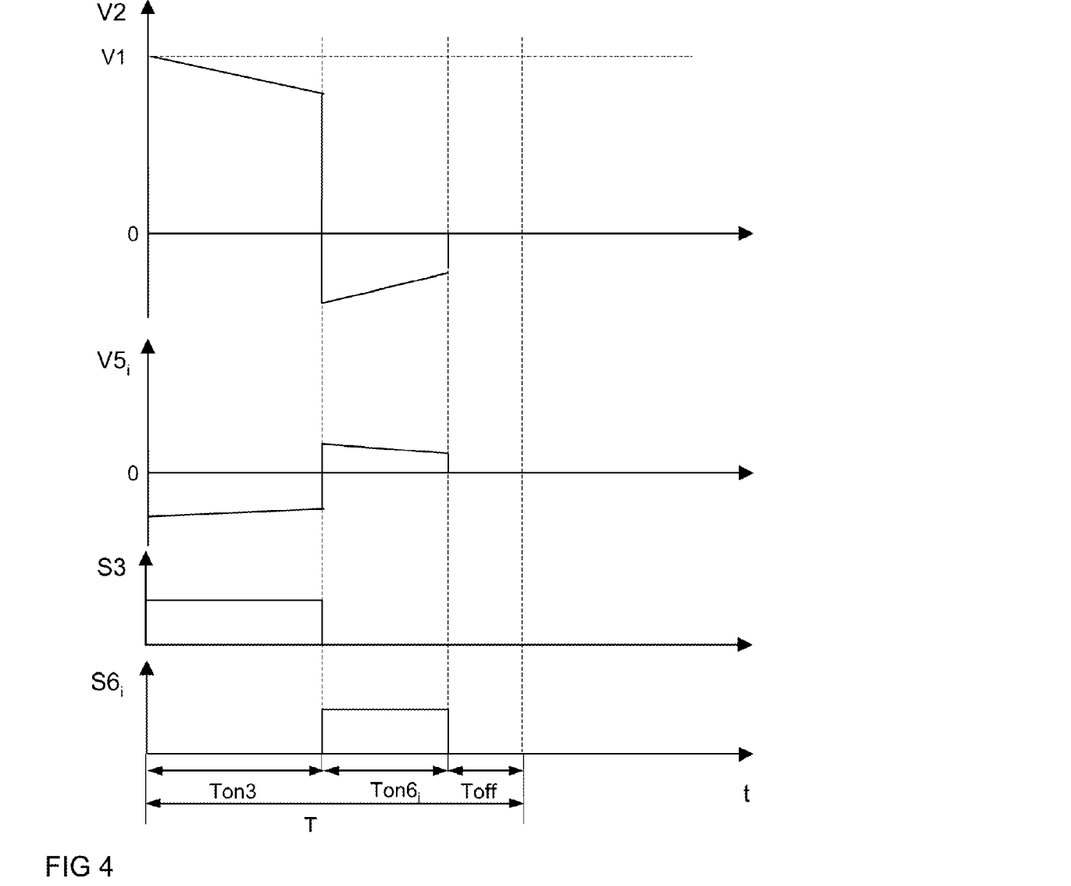
FIG. 4 shows timing diagrams which illustrate a first charge balancing mode (bottom balancing)
Figure 5:
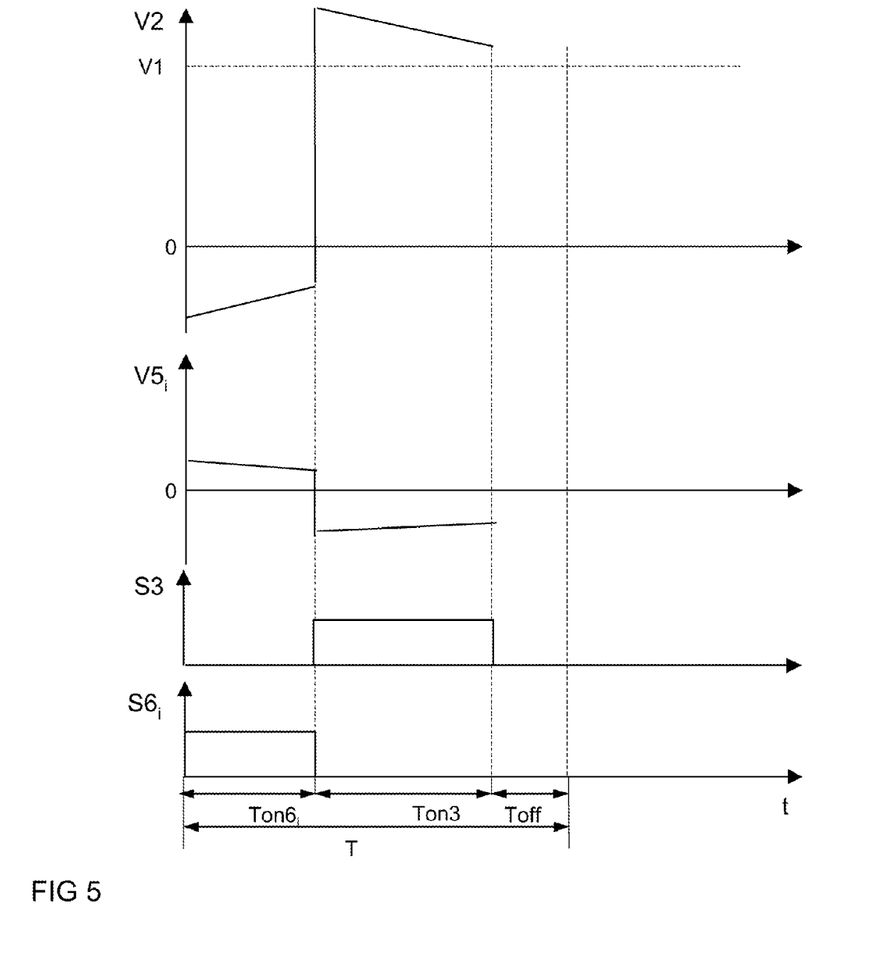
FIG. 5 shows timing diagrams which illustrate a second charge balancing mode (top balancing)

The operating principle of the charge balancing circuit will now be explained with reference to FIGS. 4 and 5. FIG. 4 illustrates the operating principle in the bottom balancing mode, and FIG. 5 illustrates the operating principle in the top balancing mode. In FIGS. 4 and 5 timing diagrams of a first voltage V2 across the first inductive storage element 2, of a second voltage V$5_i$ across a first one $5_i$ of the second inductive storage elements $5_1$-$5_n$, of the first drive signal S3, and of the drive signal S$6_i$ of a first one $6_i$ of the switching elements $6_1$-$6_n$ connected in series with the first one $5_i$ of the second inductive storage elements $5_1$-$5_n$ are shown. In this connection it should be noted that the first one $5_i$ of the second inductive storage elements $5_1$-$5_n$ can be any one of the inductive storage elements illustrated in FIG. 1.

In FIG. 4, the timing diagrams are illustrated during one balancing cycle having a duration T. One balancing cycle in the bottom balancing mode includes at least two time periods: a first time period Ton3 during which the first switching element 3 is switched on so as to connect the first inductive storage element 2 in parallel with the storage arrangement 1; and a second period Ton$6_i$ in which the second switching elements $6_i$ is switched on so as to connect the first one $5_i$ of the second inductive storage elements in parallel with the associated storage cell $1_i$. In FIG. 4, the on-state of the first switching element 3 is represented by a high-level of the first drive signal S3, and the on-state of the second switching element $6_i$ is represented by a high-level of the corresponding drive signal S$6_i$. Thus, the on-levels of the drive signals correspond to high-signal levels. However, this is only an example. The on-levels of the individual drive signals could also be low-levels.

In the embodiment illustrated in FIG. 4, the drive cycle T includes an optional third time period Toff after the second time period Ton$6_i$ and before a new balancing cycle starts. During this third time period Toff the first and second switching elements 3, $6_i$ are switched off. During this off-time oscillations of the first and second voltages V2, V$5_i$ may occur. However, these oscillations are not shown in FIG. 4. During the first time period Ton3, when the first switching element 3 is switched on, the voltage V2 across the first inductive storage element 2 decreases. During this time period the voltage V2 is given by:

$$V2 \cdot V1 - R_{ON3} \cdot I3 \quad (1),$$

wherein V1 is the voltage across the charge storage arrangement, $R_{ON3}$ is the on-resistance of the first switching element 3, and I3 is the current through the first inductive storage element 2 and the first switching element 3. Since the current I3 increases with time, the voltage V2 across the first inductive storage element decreases with time. Assume, that the first and second inductive storage elements 2, $5_1$-$5_n$ are implemented as coils and that a winding ratio N2/N5 between the number of windings N2 of the first inductive storage element 2 and the number of windings N5 of the second inductive storage elements $5_1$-$5_n$ is equal for each of the second inductive storage elements $5_1$, $5_n$, and that the winding senses of the first inductive storage element 1, on the one hand, and the second inductive storage elements $5_1$, $5_n$, on the other hand, are opposite. In this case, the voltage V$5_i$ across the second inductive storage element $5_i$ is given by:

$$V5_i = -V2 \cdot N5/N2 \quad (2).$$

It should be noted that by virtue of the inductive coupling between the individual second inductive storage elements $5_1$-$5_n$ the voltages across the second inductive storage elements $5_1$-$5_n$ are equal, so that V$5_i$ in FIG. 4 represents the voltage across each of the second inductive storage element, not only across the second inductive storage $5_i$ element which has its associated switching element 6, switched on in the subsequent second time period.

During the first time period Ton3 energy is taken from the charge storage arrangement 1 and is stored as magnetic energy in the first inductive storage element 2. During this first time period Ton3 the first voltage V2 across the first inductive storage element 2 is positive, while the second voltages V$5_1$-V$5_n$ (represented by V$5_i$ in FIG. 4) are negative. At the beginning of the second time period Ton$6_i$, when a first one $6_i$ of the second switching element is switched on, and the first switching element 3 is switched off, the first voltage V2 turns negative, while the second voltages V$5_i$ turn positive. The second voltages V$5_i$ in the second time period are given by:

$$V5_i = V1_i + I6_i \cdot R_{ON6}i \quad (3),$$

wherein V$1_i$ is the voltage across the storage element associated with the switching element $6_i$ and the second inductive storage element $5_i$ into which energy is to be fed back. I$6_i$ is the current through this second switching element $6_i$, and $R_{ON6}i$ is the on-resistance of this second switching element $6_i$.

The voltage V2 across the first inductive storage element during the second time period Ton$6_i$ is given by:

$$V2 = -V5_i \cdot N2/N5 \quad (4).$$

FIG. 4 illustrates an ideal scenario in which the second switching element $6_i$ is switched on at the time at which the first switching element 3 is switched off. In a non-ideal scenario there is a short delay between the time at which the first switching element 3 is switched off and the second switching element $6_i$ is switched on. In order to prevent the charge balancing circuit from being damaged during this delay time, free-wheeling elements, like diodes, can be connected in parallel with the individual second switching elements $6_1$-$6_n$ and also in parallel with the first switching element 3. These free wheeling elements allow the current $I6_i$ to flow before the switching element $6_i$ is switched on. MOSFET, like the n-type MOSFET illustrated in FIG. 1, have integrated body diodes which can act as free wheeling diodes and which allow a current to flow when, like during the second time period $Ton6_i$, the MOSFET acting as second switching elements $6_i$ are reverse biased.

Since the voltages across the second inductive storage elements $5_1$-$5_n$, by virtue of their inductive coupling, are equal, the storage cell with the lowest supply voltage will (automatically) be charged during the free wheeling phase. The drive circuit 7 is configured to switch on the second switching element $6_i$ associated with the storage cell $1_i$ having the lowest supply voltage during the second time period $Ton6_i$, so that after switching on the associated second switching element $6_i$ the storage cell with the lowest supply voltage will further be charged in one balancing cycle of the bottom balancing process. The voltage drops across the other second inductive storage elements which are associated with storage cells having higher supply voltages are not sufficient to charge storage cells other than the storage cells with the lowest supply voltage.

Of course, the storage cell having the lowest supply voltage can change from balancing cycle to balancing cycle. In a manner not illustrated in detail, the drive circuit 7 receives the supply voltages $V5_1$-$V5_n$ of the individual storage cells and is configured to determine the storage cell having the lowest supply voltage in order to decide which of the second switching elements $6_1$-$6_n$ is to be switched on during the second time period in a bottom balancing cycle. Any conventional method for measuring the supply voltages $V5_1$-$V5_n$ of the individual storage cells can be used to provide the required voltage information to the drive circuit 7. According to one embodiment, the drive circuit 7 can enter a measurement mode in which the drive circuit 7 subsequently switches the second switching elements $6_1$-$6_n$ on for short time periods, wherein these time periods are significantly shorter than the first and second time periods during the balancing cycles. In each measurement cycle in which one of the second switching elements $6_i$ is switched on, the voltage across the associated storage cell $1_i$ can be measured by measuring. When one of the switching elements 6, is switched on, the voltage drop across the associated second inductive storage element $5_i$ equals the supply voltage $V1_i$ of the associated storage cell $1_i$. By virtue of the inductive coupling between the individual second conductive storage elements $5_1$-$5_n$ the voltage across the associated second inductive storage element $5_i$ can be measured by measuring the voltage across any one of the second inductive storage elements $5_1$-$5_n$. Thus, by subsequently switching on the second switching element $6_1$-$6_n$ for short time periods and by measuring the voltage across only one of the inductive storage elements $5_1$-$5_n$ the supply voltages of the individual storage cells $1_1$-$1_n$ can be measured. Again, this is only one embodiment for measuring the voltage across the individual storage cells $1_1$-$1_n$. Of course, any other measuring method may be used as well.

FIG. 5 illustrates the operating principle of the charge balancing circuit in the top balancing mode. In the top balancing mode energy is taken from a first one $1_i$ of the storage cells $1_1$-$1_n$ by switching on the associated second switching element $6_i$ so as to store magnetic energy in the associated second inductive storage element $5_i$. Referring to FIG. 5, one balancing cycle in the top balancing mode includes a first time period $Ton6_i$ when the first one $6_i$ of the second switching elements $6_1$-$6_n$ is switched on, a subsequent second time period $Ton3$ when the first switching element 3 is switched on, and an optional third time period Toff when all the switching elements are switched off. During this off-time oscillations of the first and second voltages V2, $V5_i$ may occur. However, these oscillations are not shown in FIG. 5.

In the top balancing mode, the first time period $Ton6_i$ is usually shorter than the first time period $Ton3$ in the bottom balancing mode, and the second time period $Ton3$ in the top balancing mode is usually longer than the second time period $Ton6_i$ in the bottom balancing mode. However, this is only an example. In the top balancing mode, the timing diagram of the second voltage $V5_i$ basically corresponds to the timing diagram of the first voltage V2 in the bottom balancing mode, and the timing diagram of the second voltage V2 in the top balancing mode basically corresponds to the timing diagram of the second voltage $V5_i$ in the bottom balancing mode. During the first time period in the top balancing mode, the second voltage $V5_i$ is given by:

$$V5_i = V1_i - R_{ON6i} \cdot I6_i \tag{5}$$

wherein $V1_i$ is the supply voltage of the storage cell associated with the second switching element $6_i$ switched on in the second time period. $R_{ON6}i$ is the on-resistance of the switching element $6_i$, and $I6_i$ is the current through this switching element. The first voltage V2 during the first time period in the top balancing mode is given by:

$$V2 = -V5_i \cdot N5/N2 \tag{6}$$

The first voltage V2 is negative during the first time period and turns positive in the second time period. In the second time period, the voltage V2 across the first inductive storage element 2 increases to above the voltage V1 of the charge storage arrangement so as to charge the charge storage arrangement. The voltage V2 across the first inductive storage element 2 in the second time period of the top balancing mode is given by:

$$V2 = V1 + R_{ON3} \cdot I3 \tag{7}$$

wherein $R_{ON3}$ is the on-resistance of the first switching element 3, and I3 is the current through the first switching element 3. This current I3 decreases with time during the second time period. The second voltages $V5_i$ during the second time period are given by:

$$V5_i = -V2 \cdot N2/N5 \tag{8}$$

The drive circuit 7 is configured to perform top balancing or bottom balancing dependent on the voltages across the individual storage cells. Top balancing is, for example, performed if the voltage across one of the storage elements is higher than the voltage across the majority of the other storage elements. In this case, the switching element $6_i$ associated with the storage cell $1_i$ having the lowest supply voltage is switched on in the second time period of one balancing cycle. Bottom balancing is, for example, performed when the voltage across one storage element is lower than the voltages across the majority of the other storage elements. In this case the switching element $6_i$ associated with the storage cell $1_i$ having the highest supply voltage is switched on in the first time period of one balancing cycle.

In the charge balancing circuit errors may occur. These errors could result in a malfunction or, in a worst-case scenario, in a damage of the charge balancing circuit. Those errors or faults of the charge balancing circuit may include: interruptions of the signal lines between the drive circuit 7 and the control terminals of the switches 3, $6_1$-$6_n$; defects of the switches 3, $6_1$-$6_n$; lack of inductive coupling between the first inductive storage element 3 and the second inductive storage elements $5_1$-$5_n$.

Figure 6:
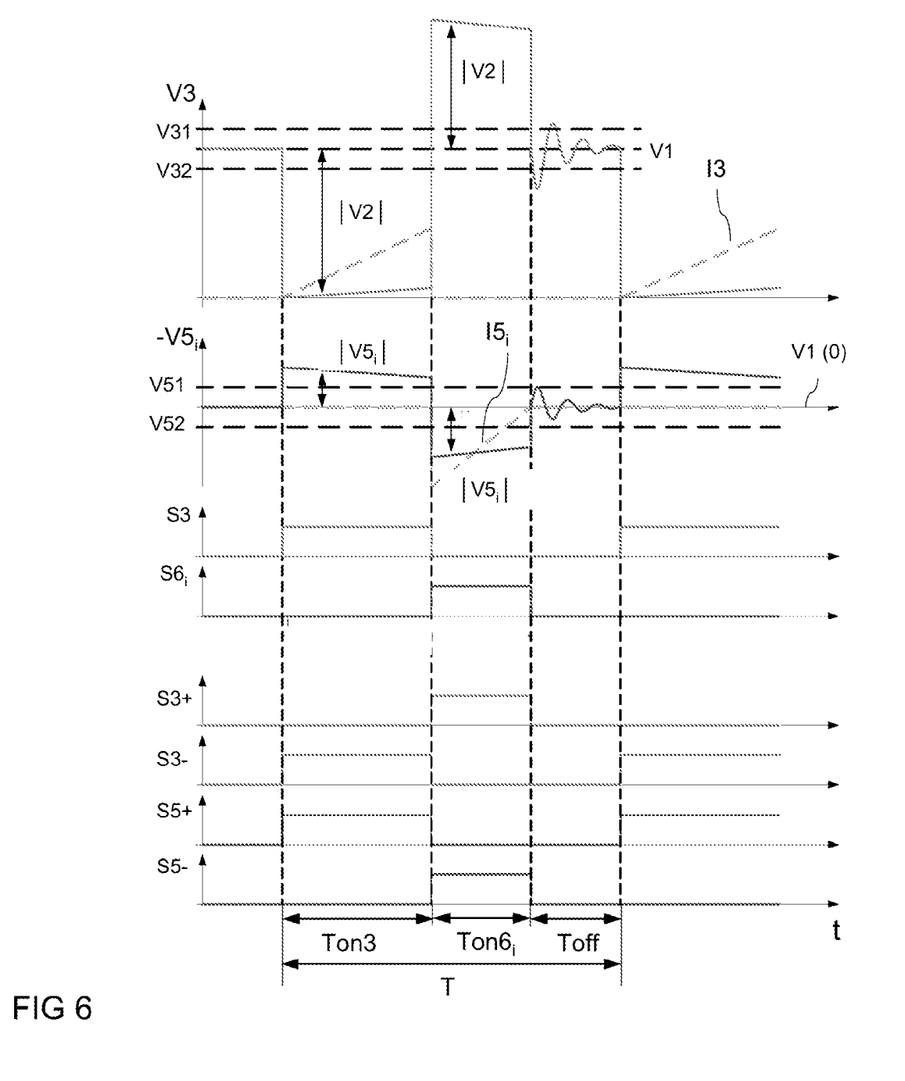
FIG. 6 shows timing diagrams which illustrate an error detection during the first charge balance mode.
Figure 7:
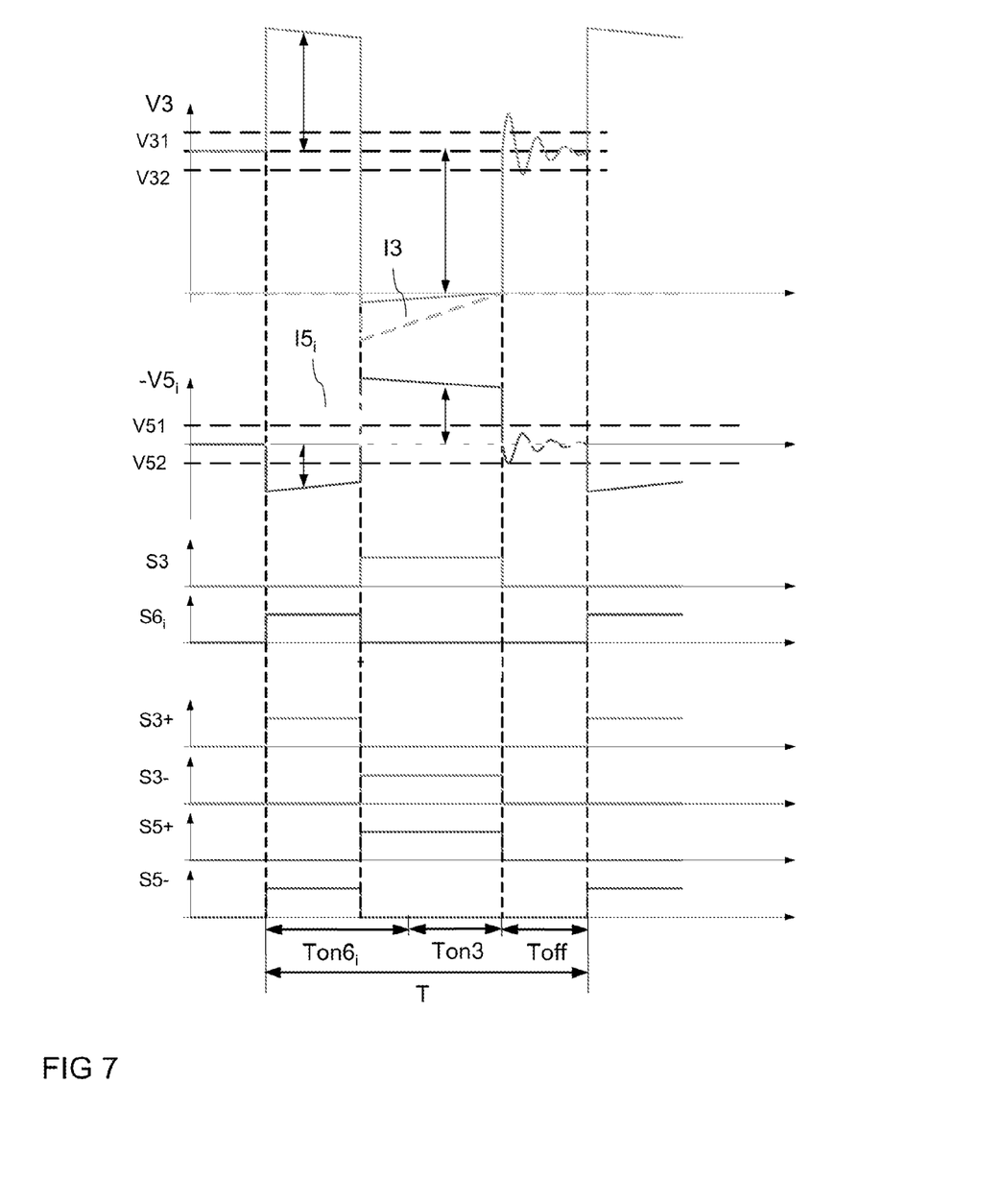
FIG. 7 show timing diagrams which illustrate an error detection during the second charge balance mode.

In order to detect at least some of these errors the balancing circuit of FIG. 1 includes an error detection circuit 8 which is configured to evaluate at least one of the first voltage V2 and the second voltage $V5_i$ at least at a first time in the first time period and at least at a second time in the second time period of a balancing cycle, wherein the balancing cycle can be a top balancing cycle or a bottom balancing cycle. The error detection performed by the error detection circuit 8 will be explained with reference to timing diagrams illustrated in FIGS. 6 and 7, wherein FIG. 6 illustrates timing diagrams in the bottom balancing mode and FIG. 7 illustrates timing diagrams in the top balancing mode. In the embodiments illustrated in FIG. 6, the voltages evaluated by the error detection circuit 8 are the voltage V3 across the first switching element 3 and one second voltage $V5_i$, wherein in FIG. 6 the negative value $-V5_i$ of this second voltage $V5_i$ is illustrated. Besides the voltages V3 and $V5_i$, FIGS. 6 and 7 also illustrate the currents I3 through the first winding 2 and the current $I5_i$ through one second winding $5_i$ corresponding to the illustrated voltage $V5_i$.

By virtue of the inductive coupling between the individual second inductive storage elements $5_1$-$5_n$ the second voltages $V5_1$-$V5_n$ are equal, so that only one $V5_i$ of these voltages has to be measured. In the circuit of FIG. 1, this measured voltage is the voltage $V5_1$ across the second inductive storage element $5_1$ which is connected between the first load terminal 11 and inductive storage element $5_2$. This, however, is only an example. The voltage across each of the other second inductive storage elements could be evaluated as well.

The switch voltage V3 across the first switch 3 is dependent on the first voltage V2 as follows:

$$V3 = V1 - V2 \quad (9),$$

wherein V1 is the voltage provided by the charge storage arrangement.

The timing diagrams of the voltage V3 and of $-V5_i$ in FIGS. 6 and 7 can easily be obtained from the timing diagrams illustrated in FIGS. 4 and 5, respectively. FIGS. 6 and 7 further illustrates the timing diagrams of the first drive signal S3 and the drive signal $S6_i$ of one of the second switching elements $6_i$, namely the switching element which is switched on in the bottom balancing cycle illustrated in FIG. 6 or which is switched on in the bottom balancing cycle illustrated in FIG. 7. Of course, the switching elements switched on in the bottom balancing cycle and the top balancing cycle can be different. In this connection it should be mentioned that instead of the voltage V3 across the switching element 3 the first voltage V2 across the inductive storage element 2 could be evaluated.

FIGS. 6 and 7 further illustrates four comparison signals: A first comparison signal S3+ obtained by comparing the switch voltage V3 with a first reference value V31; a second comparison signal S3− obtained by comparing the switch voltage V3 with a second reference value V32; a third comparison signal S5+ obtained by comparing the second voltage $V5_i$ with a third reference value V51; and a fourth comparison signal S5− obtained by comparing the second voltages $V5_i$ with a fourth reference value V52.

In the bottom balancing cycle illustrated in FIG. 6, the first reference value V31 serves to detect if the switch voltage V3 during the second time period $Ton6_i$ rises above the supply voltage V1 provided by the charge storage arrangement 1. The second reference value V32 serves to detect if the switch voltage V3 falls below the supply voltage V1 during the first time period $Ton6_i$. The third reference value V51 serves to detect if the second voltage $V5_i$ is positive in the first time period, and the fourth reference value V52 serves to detect if the second voltage $V5_i$ is negative during the second time period.

In the top balancing cycle illustrated in FIG. 7, the first reference value V31 serves to detect if the switch voltage V3 during the first time period Ton3 rises above the supply voltage V1 provided by the charge storage arrangement 1. The second reference value V32 serves to detect if the switch voltage V3 falls below the supply voltage V1 during the second time period Ton3. The third reference value V51 serves to detect if the second voltage $V5_i$ is positive in the second time period Ton3, and the fourth reference value V52 serves to detect if the second voltage $V5_i$ is negative during the first time period $Ton6_i$.

In the embodiments illustrated in FIGS. 6 and 7, the first reference value V31 is higher than the supply voltage V1, and the second reference value V32 is lower than the supply voltage V1.

According to one embodiment, the voltage $V5_i$ across one of the second inductive storage elements $5_i$ is evaluated. This voltage $V5_i$, referring to FIG. 4, is below zero in the first time period Ton3 and is above zero in the second time periods $Ton6_i$. When the negative voltage $-V5_i$ is evaluated, as shown in the embodiment of FIG. 6, the third reference voltage V51 is above zero and the fourth reference voltage V52 is below zero.

The second voltage $V5_i$ which is evaluated in order to detect an error will be referred to as evaluated second voltage in the following. According to one embodiment, the evaluated second voltage is the voltage $V5_1$ across that second inductive storage element $5_1$ directly connected to the first load terminal. In this case, $-V5_1$ is a voltage relative to the first supply voltage V1 (which is indicated in parenthesis in FIG. 6), so that the third reference voltage V51 is selected to be above the supply voltage V1 (instead of above zero), and the fourth reference voltage V52 is selected to be below the supply voltage V1 (instead of below zero). In this case, the third reference value V51 may correspond to the first reference value V31 and the fourth reference value V52 may correspond to the second reference value V32.

The comparison signals can assume two different signal values dependent on the relation between the voltages represented by the individual comparison signals. In the embodiment illustrated in FIG. 6, the comparison signals are generated such that the first comparison signal S3+ has a high-level, when the switch voltage V3 is higher than the first reference voltage V31, that the second comparison signal S3− has a high level when the switch voltage V3 is below the second reference value V32, that the third comparison signal S5+ has a high-level when the second voltage $V5_i$ is higher than the third reference value V51, and that the fourth comparison signal S5− has a high level when the second voltage $V5_i$ is below the fourth reference value V52.

In the bottom balancing mode, the second comparison signal S3− and the third comparison signal S5+ can be used for error detection. Referring to FIG. 6, in which timing diagrams of the switch voltage V3 and the second voltage $V5_i$ and of the comparison signals in normal (error-free) operation is illustrated, the second and third comparison signals S3−, S5+ change their signal value at the end of the first time period and the beginning of the second time period during the balancing cycle. As will be explained in further detail hereinbelow one or both of the second and third comparison signals S3−, S5+ do not change their signal values in the balancing cycle when an error has occurred. Thus, by simply detecting whether the second and third comparison signals S3−, S5+ change their signal value an error can be detected. This type of detection can be performed by simply detecting rising or falling edges in the comparison signal, if a rising or a falling edge of these comparison signals occurs during one bottom balancing cycle, then the charge balancing circuit is in normal operation. If there is no rising or falling edge there is probably an error in the balancing circuit. According to a further embodiment, the comparison signals are sampled at a first time in the first time period and at a second time in the second time period and the sample values are compared, wherein there is a change in the comparison signals when the sample results are different. Circuits and methods for detecting a signal change in signals like the comparison signals illustrated in FIGS. 6 and 7 are commonly known, so that no further explanations are required in this regard.

Using the second and third comparison signal S3−, S5+ the following errors may be detected in the bottom balancing mode:

I.

If, for example, the signal communication between the driver circuit 7 and the first switch 3 is interrupted, both, the second and third comparison signals S3−, S5+, do not change their signal states. In this case, the first switching element 3 cannot be switched on. Thus, the switch voltage V3 never falls below the second reference value V32, so that the second comparison signal S3− is kept on its low-level. Consequently, the second voltage $V5_i$ in the first time period of the balancing cycle does not decrease or the negative value $-V5_i$ never increases, so that the third comparison signal S5+ is also kept on its low-level.

II.

If, for example, the first inductive storage element 2 is defective, so that there is no inductive coupling between the first inductive storage element 2 and the second inductive storage elements $5_1$-$5_n$, then the second comparison signal S3− may change its signal value, but the third comparison signal S5+ does not change its signal value.

According to one embodiment, an optional fuse 10 is connected in series with the first inductive storage element 2. This fuse is, for example, blown before the first inductive storage element 2 is damaged. A third comparison signal S5+ which does not change its signal value may, therefore, also indicate that the fuse 10 is defective (blown). Further, a third comparison signal S5+ which does not change its signal value may also indicate that the first switching element 3 is defective.

Thus, by evaluating the second and third comparison signals S3−, S5+ two different errors can be detected: a first error I, when both of the second and third comparison signals S3−, S5+ are kept on their low levels; and a second error II when only the second comparison signal S3− is kept on its-low level (does not change).

The error detection circuit 8 generates an error signal $S_{ERR}$ indicating whether an error has been detected. The error detection circuit 8 can be configured to evaluate only one of the second and third comparison signals S3−, S5+ like, for example, the second comparison signal. In this case, an error is detected when the evaluated comparison signal does not change its signal level in the first and second time periods Ton3, $Ton6_i$. The error signal $S_{ERR}$ can be generated to assume one of two levels: a first level when no error has been detected; and a second level when an error has been detected.

According to another embodiment, the error detection circuit 8 evaluates both, the second and third comparison signals. In this case, two different errors can be distinguished: a first error when only one of the evaluated comparison signals, like the second comparison signal S3−, does not change its signal level; and a second error when none of the two comparison signals changes its signal level. In this case, the error signal $S_{ERR}$, may include two sub-signals from which one serves to indicate the first error and from which the other one serves to indicate the second error.

In the top balancing mode the first and fourth comparison signals S3+, S5− can be used for error detection purposes. The following errors can be detected:

III.

If, for example, there is no signal communication between the driver circuit 7 and the second switching element $6_i$ which should be switched on in the top balancing cycle during the first time period, the second voltages $V5_i$ do not increase, or $-V5_i$ does not decrease during the first time period $Ton6_i$, so that the fourth comparison signal S5− is kept on its low-level. Consequently, the switch voltage V3 does not increase during the first time period, so that the first comparison signal S3+ is also kept on its low level.

IV.

The first comparison signal S3+ is kept on its low-level when, for example, the secondary winding associated with the storage cell which is to be discharged in the top balancing cycle is defect, or when there is no inductive coupling between the secondary winding and the primary winding.

V.

The fourth comparison signal S5− is kept on its low-level, when there is no magnetic coupling between the secondary windings.

Thus, by evaluating the first and fourth comparison signals S3+, S5− three different errors can be detected: a third error III, when only the fourth comparison signal is kept on its-low level (does not change); a fourth error IV, when only the first comparison signal S3+ is kept on its low level; and a fifth error V, when both of the first and fourth comparison signals S3+, S5− are kept on their low levels.

The error detection circuit 8 can be configured to evaluate only one the first and fourth comparison signals S3+, S5−, or can be configured to evaluate both these comparison signals S3+, S5−. Accordingly, the error signal $S_{ERR}$ is generated by the error detection signal to represent only the third or fourth error, or to represent three errors III, IV, V. According to one embodiment, the error signal $S_{ERR}$ includes two sub-signals from which one indicates if the first comparison signal S3+ is kept on its low level in the first and second time periods $Ton6_i$, Ton3, and form which the other one indicates if the fourth comparison signal S5− is kept on its low level in the first and second time periods $Ton6_i$, Ton3. In this case, the three different errors that may occur are represented by the two sub-signals.

According to one embodiment, the error detection circuit 8 is configured to evaluate the switch voltage V3 and the second voltage $V5_i$ (or its negative equivalent $-V5_i$) only during the first and second time periods of one switching cycle. Therefore, oscillations which may occur in the off-time Toff cannot negatively influence the error detection. The error detection circuit 8 can be configured to detect errors in only one of the bottom and the top balancing modes, or in both modes.

When the first switching element 3 and the second switching elements 6*i* are implemented as MOSFET with an integrated body diode, then it is not necessary to switch on the first switching element 3 in the second phase of a top balancing cycle, and it is not necessary to switch on the second switching elements 6*i* in the second phase of a bottom balancing cycle. In these phases the body diode would allow the charging current to flow. However, in order to keep losses low, these switching elements 3, 6*i* are switched on during these phases of the top and bottom balancing cycles, wherein the on-times of these switches 3, 6*i* are selected such that (a) in the top balancing mode, the energy previously stored in the transformer can be transferred to the charge storage arrangement 1 during the on-time of the first switching element 3, and (b) in the bottom balancing mode, the energy previously stored in the transformer can be transferred to one 1*i* of the storage cells during the on-time of the corresponding second switching element 6*i*.

In the top balancing mode as well as in the bottom balancing mode a new balancing cycle should not be started before a balancing process in a previous balancing cycle has been finished. In the top balancing mode, a balancing process is finished when the energy taken from one 1*i* of the individual storage cells has been completely transferred into the charge storage arrangement 1. In the bottom balancing mode, a balancing process has been finished when the energy taken from the charge storage arrangement 1 has been completely fed back into one 1*i* of the storage cells.

According to one embodiment, in the bottom balancing mode, the first comparison signal S3+ and the fourth comparison signal S5− are evaluated in order to determine if a balancing process has been finished. In the embodiment illustrated in FIG. 6, falling edges of the first and fourth comparison signals S3+, S5− indicate that energy previously taken from the charge storage arrangement 1 has been completely fed back into one 1*i* of the storage cells. Thus, according to one embodiment, a new bottom balancing cycle should not be started before falling edges of the first and fourth comparison signals S3+, S5− have been detected. Equivalently, in the top balancing mode, the second and third comparison signals S3−, S5+ are evaluated. In the embodiment illustrated in FIG. 7 falling edges of the second and third comparison signals S3−, S5+ indicate that energy previously taken from one of the storage cells 1*i* has been completely fed back into the charge storage arrangement 1. Thus, according to one embodiment, a new top balancing cycle should not be started before falling edges of the second and third comparison signals S3−, S5+ have been detected.

In the embodiment illustrated in FIG. 6, the time when a falling edge of the drive signal S6, occurs corresponds to the times when falling edges of the first and fourth comparison signals S3+, S5− occur. According to one embodiment, the first and fourth comparison signals S3+, S5− are evaluated and the switching element 5*i* (which is associated with the storage cell 1*i* charged in a bottom balancing cycle) is switched off, i.e., its drive signal S6*i* assumes an off-level, when falling edges of these first and fourth comparison signals S3+, S5− are detected. Equivalently, in the top balancing mode illustrated in FIG. 7, the first switching element 3 can be switched off each time falling edges of the second and third comparison signals S3−, S5+ are detected.

Figure 8:
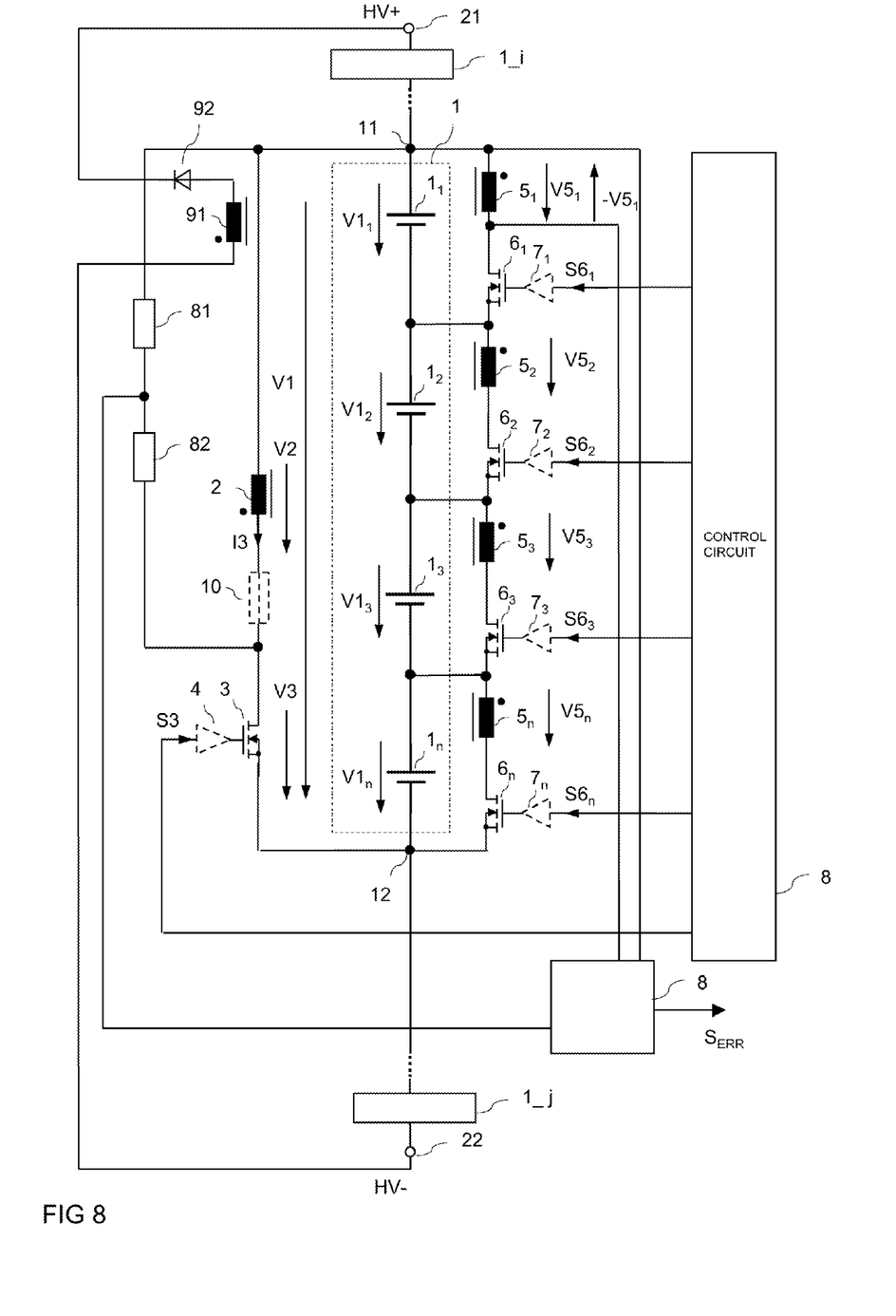
FIG. 8 illustrates a further embodiment of a charge balancing circuit.

FIG. 8 illustrates a further embodiment of a charge balancing circuit. In this charge balancing circuit the voltage V1 across the primary winding 2 instead of the voltage V3 across the switching element 3 is evaluated. However, this is only an example. Referring to what has been explained hereinbefore, the voltage V3 across a switching element 3 could be evaluated as well.

The charge balancing circuit of FIG. 8 includes a further winding 91 that has the same winding sense as the primary winding 2 and that will be referred to as second primary winding 91 in the following. The second primary winding 91 is electrically coupled between supply terminals 21, 22. The charge storage arrangement 1 and at least one further storage arrangement 1_*i*, 1_*j* are connected in series between these supply terminals 21, 22. The at least one further charge storage arrangement 1_*i*, 1_*j* can be implemented like the charge storage arrangement 1 with a plurality of charge storage cells. The series circuit with the charge storage arrangement 1 and the at least one further charge storage arrangement 1_*i*, 1_*j* forms, for example, a battery stack or a battery arrangement, wherein the individual charge storage arrangements form blocks or modules of the battery stack and may each include a plurality of battery cells connected in series. In FIG. 8, HV+ is the potential at the first supply terminal 21, and HV− is the potential at the second supply terminal 22.

Charge balancing circuits, like the charge balancing circuit which has been explained hereinbefore, may be connected to the at least one further charge storage module 1_*l*, 1_*j*. However, these charge balancing circuits are not illustrated in FIG. 8.

When the charge balancing circuit illustrated in FIG. 8 is operated in the top balancing mode, energy is taken from one of the individual storage cells 1*i* in a first time period in which the associated switching element 6*i* is switched on. After the associated switching element 6*i* has switched off, the energy taken from the storage cell 1*i* is fed back either into the charge storage module 1 via the primary winding 2, or into the module stack with the individual modules 1, 1_*i*, 1_*j* connected in series via the second primary winding 91. A rectifier element 10 is connected in series with the second primary winding 91, wherein this rectifier element 10 is connected such that the module stack can not be discharged via the second primary winding 91.

Whether the energy taken from one of the storage cells 1*i* is fed back into the module 1 via the primary winding 2 or into the module stack 1, 1_*i*, 1_*j* via the second primary winding 91 is dependent on the voltage V5*i* of the storage cell 1*i* which is discharged and is dependent on a winding ratio N91/N2 between the number of windings N91 of the second primary winding 91 and the number of windings N2 of the primary winding 2. Assume that a number of m modules are connected in series which are identical and which, therefore, have the same nominal voltage. According to one embodiment, a winding ratio N9/N2 is between 0.8·m and 1.2·m. When the winding ratio is N91/N2=m, then the energy is fed back into the overall arrangement when the voltage V1 across the module 1 is higher than the mean value of the voltages across the individual modules 1, 1_*i*, 1_*j* connected in series. When the winding ratio N9/N2 is 0.8·m, then the voltage of the module 1 has to be 20% higher than the mean voltage across the individual modules in order to feed back the energy taken from one 1*i* storage cell into the over all arrangement in stead of the module 1. In other words, the energy stored in the transformer (in the second inductive storage element 5*i*) when one 6*i* of the second switching elements is switched on, is fed back into the module stack when the product V1·m of the voltage V1 across the module 1 and the winding ratio m is larger than the overall voltage across the module stack, which is the voltage between the first and second supply terminals 21, 22. The second primary winding 91 helps to perform a second type of a top balancing in which energy taken from one 1*i* storage cell is fed into the overall arrangement with the plurality of modules 1, 1_*i*, 1_*j*.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for charge balancing in a charge storage arrangement having a plurality of charge storage cells connected in series, the method comprising:
    providing a first inductive storage element configured to be selectively coupled with the storage arrangement;
    providing at least one second inductive storage element configured to be selectively coupled with a first one of the storage cells and inductively coupled to the first inductive storage element;
    during a first time period, taking energy from one of the storage arrangement or the first one of the storage cells by coupling an associated inductive storage element with the storage arrangement or the first one of the storage cells, respectively;
    during a second time period subsequent to the first time period, feeding back at least a part of the taken energy into the other one of the storage arrangement or the first one of the storage cells by coupling the associated inductive storage element with the other one of the storage arrangement or the first one of the storage cells, respectively;
    evaluating at least one of a first voltage and/or a second voltage at least at one time in the first time period to provide a first evaluation result and at least at one time in the second time period to provide a second evaluation result, wherein the first voltage is dependent on the voltage across the first inductive storage element and the second voltage is dependent on the voltage across one of the storage cells; and
    detecting a fault in circuitry coupled to the charge storage cells based on the first and the second evaluation result.

2. The method of claim 1, wherein the first voltage is a voltage across the first inductive storage element.

3. The method of claim 1, wherein the first voltage corresponds to a difference between a voltage across the storage arrangement and a voltage across the first inductive storage element.

4. The method of claim 1, wherein the second voltage is a voltage across the first one of the storage cells.

5. The method of claim 1, wherein evaluating the first voltage comprises comparing the first voltage with at least one reference value to obtain a first comparison signal, wherein a fault is detected when the first comparison signal does not change between the first and the second time.

6. The method of claim 1, further comprising:
    comparing the first voltage with a first reference value to obtain a first comparison signal; and
    comparing the second voltage with a second reference value to obtain a second comparison signal,
    wherein a fault is detected when at least one of the first and second comparison signals does not change between the first and second times.

7. The method of claim 1, wherein evaluating the second voltage comprises comparing the second voltage with at least one further reference value to obtain a further comparison signal, wherein a fault is detected, when the further comparison signal does not change between the first and the second time.

8. The method of claim 7, further comprising:
    comparing the second voltage with a third reference value to obtain a third comparison signal; and
    comparing the second voltage with a fourth reference value to obtain a fourth comparison signal,
    wherein a fault is detected when at least one of the third and fourth comparison signals does not change between the first and second times.

9. The method of claim 1, wherein evaluating the first and second voltages comprises:
    comparing the first voltage with at least one of a first reference voltage and a second reference voltage to obtain at least one of a first comparison signal and a second comparison signal; and
    comparing the second voltage with at least one of a third reference voltage and a fourth reference voltage to obtain at least one of a third comparison signal and a fourth comparison signal,
    wherein a fault is detected when one of the first and second comparison signals and one of the third and fourth comparison signals do not change between the first and second times.

10. The method of claim 9, which comprises a sequence of balancing cycles, with each balancing cycle including a first time period and a subsequent second time period, the method further comprising:
    evaluating at least one of the first, second, third and fourth comparison signal; and
    starting a new balancing cycle dependent on the evaluation result.

11. The method of claim 10, wherein a new balancing cycle is started after a predetermined edge of the at least one of the comparison signals.

12. The method of claim 11, wherein a new balancing cycle is started after a predetermined edge of the first and third comparison signals.

13. The method of claim 11, wherein a new balancing cycle is started after a predetermined edge of the second and fourth comparison signals.

14. A charge balancing circuit, comprising:
    a first inductive storage element configured to be selectively coupled with a storage arrangement comprising a plurality of storage cells connected in series;
    at least one second inductive storage element configured to be selectively coupled with a first one of the storage cells of the storage arrangement and inductively coupled to the first inductive storage element;
    a drive circuit configured
        to cause one of the first inductive storage element or the second inductive storage element to be coupled with an associated storage arrangement or first one of the storage cells for a first time period, and
        to cause the other one of the first inductive storage element or the second inductive storage element to be coupled with the associated storage arrangement or first one of the storage cells for a second time period subsequent to the first time period; and
    an error detection circuit configured
        to evaluate at least one of a first voltage and a second voltage at least at one time in the first time period to obtain a first evaluation result and at least at one time in the second time period to obtain a second evaluation result, wherein the first voltage is dependent on a voltage across the first inductive storage element and the second voltage is dependent on a voltage across one of the storage cells, and to generate an error signal dependent on the first and the second evaluation results, wherein the error signal indicates a fault in circuitry coupled to the storage arrangement.

15. The charge balancing circuit of claim 14, further comprising:

a first switching element coupled in series with the first inductive storage, controlled by the drive circuit and configured to couple the first inductive storage element to the storage arrangement; and at least one second switching element coupled in series with the at least one second inductive storage element, controlled by the drive circuit and configured to couple the at least one second inductive storage element to the first storage cell.

16. The charge balancing circuit of claim 14, wherein the first voltage is the voltage across the first inductive storage element.

17. The charge balancing circuit of claim 14, wherein the first voltage corresponds to a difference between a voltage across the storage arrangement and the voltage across the first inductive storage element.

18. The charge balancing circuit of claim 14, wherein the second voltage is the voltage across the one of the storage cells.

19. The charge balancing circuit of claim 14, wherein the error detection circuit is configured to compare the first voltage with at least one reference value to obtain a first comparison signal, and to generate an error indicating signal level of the error signal, when the first comparison signal does not change between the first and the second time.

20. The charge balancing circuit of claim 14, wherein the error detection circuit is configured to compare the first voltage with a first reference value to obtain a first comparison signal, to compare the second voltage with a second reference value to obtain a second comparison signal, and to generate an error indicating signal level of the error signal when at least one of the first and second comparison signals does not change between the first and second times.

21. The charge balancing circuit of claim 14, wherein the error detection circuit is configured to compare the second voltage with at least one further reference value to obtain a further comparison signal, and to generate an error indicating signal level of the error signal, when the further comparison signal does not change between the first and the second time.

22. The charge balancing circuit of claim 21, wherein the error detection circuit is configured to compare the second voltage with a third reference value to obtain a third comparison signal, to compare the second voltage with a fourth reference value to obtain a fourth comparison signal, and to generate an error indicating signal level of the error signal, when at least one of the third and fourth comparison signals does not change between the first and second times.

23. The charge balancing circuit of claim 14, wherein the error detection circuit is configured to compare the first voltage with at least one of a first and second reference voltage to obtain at least one of a first and second comparison signals, to compare the second voltage with at least one of a third and fourth reference voltage to obtain at least one of a third and fourth comparison signal, and to generate an error indicating signal level of the error signal when one of the first and second comparison signals and one of the third and fourth comparison signals do not change between the first and second times.

24. The charge balancing circuit of claim 15, wherein the fault in the circuitry coupled to the storage arrangement comprises at least one of:

interruptions of a signal line between the drive circuit and the first switching element;

interruptions of a signal line between the drive circuit and the at least one second switching element;

defects in the first switching element;

defects in the at least one second switching element; and lack of inductive coupling between the first inductive storage element and the at least one second inductive storage element.

25. The method of claim 1, wherein detecting the fault in circuitry coupled to the charge storage cells comprises detecting at least one of:

interruptions of signal lines between a drive circuit and switches coupled to the at least one second inductive storage element;

defects in the switches coupled to the at least one second inductive storage element; and lack of inductive coupling between the first inductive storage element and the at least one second inductive storage element.

* * * * *